US012795856B2

(12) United States Patent
Isoya

(10) Patent No.: US 12,795,856 B2
(45) Date of Patent: Nov. 10, 2026

(54) COOLING DEVICE

(71) Applicant: NEC Platforms, Ltd., Kawasaki (JP)

(72) Inventor: Satoshi Isoya, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 229 days.

(21) Appl. No.: 18/567,884

(22) PCT Filed: Apr. 4, 2022

(86) PCT No.: PCT/JP2022/017022
§ 371 (c)(1),
(2) Date: Dec. 7, 2023

(87) PCT Pub. No.: WO2022/264662
PCT Pub. Date: Dec. 22, 2022

(65) Prior Publication Data

US 2024/0284632 A1 Aug. 22, 2024

(30) Foreign Application Priority Data

Jun. 14, 2021 (JP) ................................ 2021-098436

(51) Int. Cl.
*H05K 7/20* (2006.01)

(52) U.S. Cl.
CPC ................................ *H05K 7/20272* (2013.01)

(58) Field of Classification Search
CPC ........... H05K 7/20272; H05K 7/20772; H05K 7/20254; H05K 7/20781; H01L 23/473; G06F 1/20; G06F 2200/201
See application file for complete search history.

(56) References Cited

U.S. PATENT DOCUMENTS

2005/0056030 A1 * 3/2005 Bash ........................ B05B 15/68 62/304
2006/0002086 A1 * 1/2006 Teneketges ........... H01L 23/473 257/E23.098

(Continued)

FOREIGN PATENT DOCUMENTS

EP 3700313 A1 8/2020
JP 2005-228216 A 8/2005

(Continued)

OTHER PUBLICATIONS

Extended European Search Report for EP Application No. 22824657.5, dated on Apr. 8, 2025.

(Continued)

*Primary Examiner* — Adam B Dravininkas
(74) *Attorney, Agent, or Firm* — Sughrue Mion, PLLC

(57) ABSTRACT

The purpose of the present invention is to provide a cooling device that enable improvement in storage capacity in a casing to which a plurality of modules including heat generation members are mounted. The cooling device includes: a supply pipe that supplies a heat medium from the outside to the inside of a casing having mounted therein a plurality of modules each including an electronic circuit substrate having a heat generation member mounted therein and a cooling member for receiving heat from the heat generation member and for cooling the heat generation member by using the heat medium; and a relay member that includes first flow channels provided inside the casing and allowing the heat medium flowing in from the supply pipe to be delivered to a plurality of directions and that distributes the heat medium to a plurality of the cooling members via the first flow channels.

7 Claims, 13 Drawing Sheets

(56) References Cited

U.S. PATENT DOCUMENTS

| | | | | |
|---|---|---|---|---|
| 2008/0163631 | A1* | 7/2008 | Campbell | G06F 1/20 62/175 |
| 2011/0134604 | A1* | 6/2011 | Attlesey | F28F 9/007 361/679.53 |
| 2013/0107457 | A1* | 5/2013 | Campbell | H05K 7/2079 361/699 |
| 2018/0063992 | A1* | 3/2018 | Wan | H05K 7/20254 |
| 2019/0182984 | A1 | 6/2019 | Chen et al. | |

FOREIGN PATENT DOCUMENTS

| | | | |
|---|---|---|---|
| JP | 2015-501489 | A | 1/2015 |
| JP | 2019-079851 | A | 5/2019 |

OTHER PUBLICATIONS

International Search Report for PCT Application No. PCT/JP2022/017022, mailed on Jul. 5, 2022.
English translation of Written opinion for PCT Application No. PCT/JP2022/017022, mailed on Jul. 5, 2022.

* cited by examiner

COOLING DEVICE

This application is a National Stage Entry of PCT/JP2022/017022 filed on Apr. 4, 2022, which claims priority from JP Patent Application 2021-098436 filed on Jun. 14, 2021, the contents of all of which are incorporated herein by reference, in their entirety.

TECHNICAL FIELD

The present disclosure relates to a technology for cooling a heat generation member.

BACKGROUND ART

PTL 1 discloses a technology for cooling a heat generation member by supplying a heat medium to a module including the heat generation member. Specifically, PTL 1 discloses a technology for cooling each of heat generation members by supplying a heat medium to each of a plurality of modules by using an outlet header that distributes the heat medium.

CITATION LIST

Patent Literature

PTL 1: JP 2005-228216 A

SUMMARY OF INVENTION

Technical Problem

There is a device such as a server in which a plurality of modules are mounted to one casing. In such a case, a pipe is connected from the outside of the casing in order to supply a heat medium to each of the modules. When the number of pipes entering and exiting the casing increases, for example, the inside of the casing is compressed by the pipes. When the inside of the casing is compressed, temperature inside the casing may rise. When an attempt is made to configure the device in such a way that the inside of the casing is not compressed, the device may be increased in size. Therefore, it is necessary to contrive storage of devices such as the pipes and the modules in the casing.

PTL 1 neither discloses nor suggests storage capacity of the casing to which the plurality of modules are mounted. It is assumed that there is a device to which the modules and the outlet header that distributes the heat medium disclosed in PTL 1 are mounted inside a casing. Here, in the outlet header of PTL 1, pipes for supplying the heat medium to the plurality of modules are arranged in parallel. That is, flow channels of the heat medium from the outlet header to the modules are all in the same direction. Therefore, the outlet header may be increased in size according to the number of modules in the casing, and the entire device may be increased in size accordingly.

The present disclosure has been made in view of the above problem, and one of purposes of the present disclosure is to provide a cooling device and the like that enable improvement in storage capacity in a casing to which a plurality of modules including heat generation members is mounted.

Solution to Problem

A cooling device according to an aspect of the present disclosure includes a supply pipe that supplies a heat medium from outside to inside of a casing to which a plurality of modules are mounted, each of the modules including an electronic circuit substrate on which a heat generation member is mounted and a cooling member that is a member that receives heat from the heat generation member and that cools the heat generation member by using the heat medium, and a relay member that is provided inside the casing, includes a first flow channel that delivers the heat medium flowing in from the supply pipe to a plurality of directions, and distributes the heat medium to each of the plurality of cooling members via the first flow channels.

ADVANTAGEOUS EFFECTS OF INVENTION

According to the present disclosure, it is possible to improve storage capacity in a casing to which a plurality of modules including heat generation members is mounted.

EXAMPLE EMBODIMENT

Hereinafter, example embodiments of the present disclosure will be described with reference to the drawings.

First Example Embodiment

An outline of a cooling device of a first example embodiment will be described.

Figure 1:
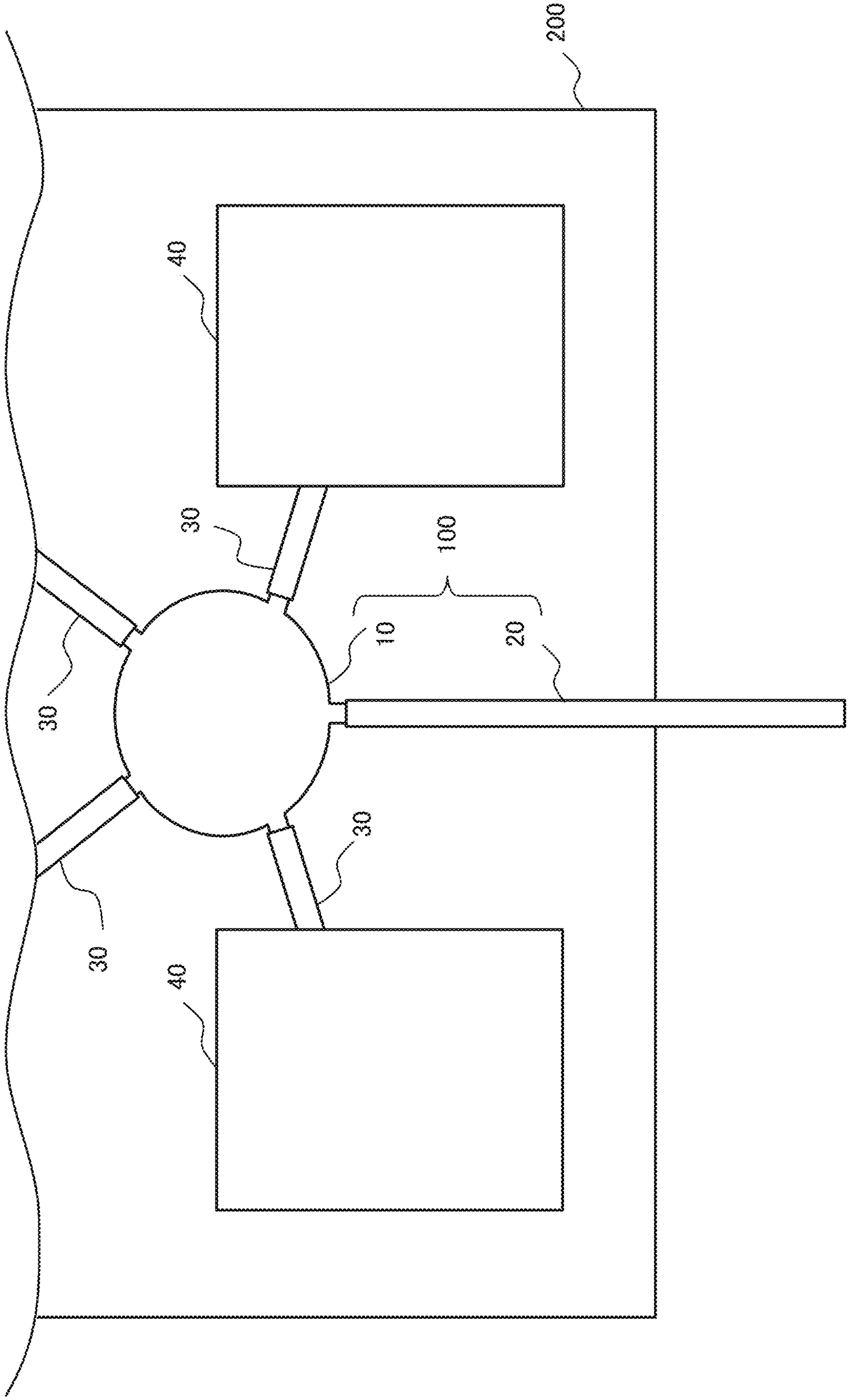
FIG. 1 is a plan view illustrating an example of a configuration of a cooling device of a first example embodiment of the present disclosure.

FIG. 1 is a plan view illustrating an example of a configuration of a cooling device 100. As illustrated in FIG. 1, the cooling device 100 includes a relay member 10 and a supply pipe 20. The relay member 10 is connected to a plurality of supply branch pipes 30.

A heat medium passes through the inside of the relay member 10, the supply pipe 20, and the supply branch pipes 30. The heat medium is, for example, a liquid, and may be referred to as cooling water. One end of the supply pipe 20 is connected to the relay member 10, and the other end of the supply pipe 20 is connected to, for example, a pump, a radiator, or the like that supplies the heat medium. The pump, the radiator, or the like is installed outside a casing 200, for example, but description of the pump, the radiator, or the like is omitted in FIG. 1. The heat medium flowing through the supply pipe 20 flows into the relay member 10.

The relay member 10 includes flow channels that deliver the heat medium in a plurality of directions. The flow channels through which the heat medium is delivered in the relay member 10 are connected to the supply branch pipes 30. That is, the heat medium is distributed from the relay member 10 to each of the supply branch pipes 30 connected in the plurality of directions. In the example of FIG. 1, the flow channels through which the heat medium is delivered in the plurality of directions are formed bisymmetrically in the relay member 10, but do not have to be formed bisymmetrically. The flow channels through which the heat medium is delivered to the supply branch pipes 30 in the relay member 10 are also referred to as first flow channels. In the present disclosure, the pipes including the branch pipes are, for example, pipes including a highly flexible material such as ethyleme propylene diene monomer (EPDM) rubber, but are not limited to this example. The pipes may be referred to as hoses or tubes.

A plurality of modules are arranged in the casing 200. Modules 40 are connected to the supply branch pipes 30. That is, the modules 40 are connected to the relay member 10 via the supply branch pipes 30. In the example of FIG. 1, the inside of the casing 200 is partially omitted. The number of modules 40 mounted to the casing 200 is not limited to a specific number. The relay members 10 may be connected to the supply branch pipes 30 as many as the number of modules mounted to the casing 200.

Figure 2:
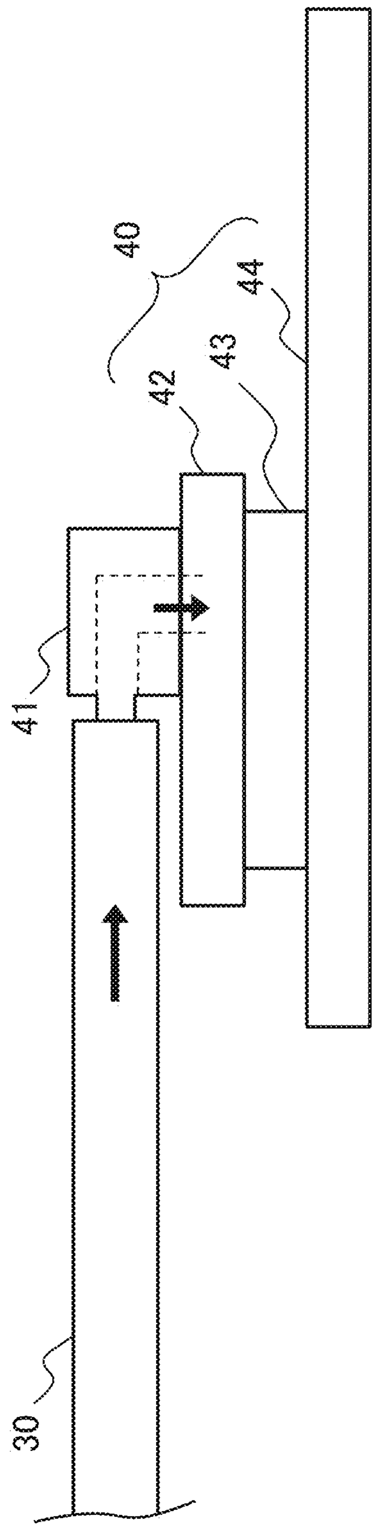
FIG. 2 is a view illustrating an example of a structure of a module of the first example embodiment of the present disclosure.

The heat medium flowing through the supply branch pipes 30 is supplied to the modules 40. FIG. 2 is a view illustrating an example of a structure of the module 40 arranged in the casing 200. As illustrated in FIG. 2, the module 40 includes, for example, an electronic circuit substrate 44 on which a heat generation member 43 is mounted, and a cooling member 42. The cooling member 42 is arranged on the heat generation member 43. The cooling member 42 is provided with a connect fitting 41 for connection with the supply branch pipe 30. The cooling member 42 is a member that receives heat from the heat generation member 43. Arrows illustrated in FIG. 2 indicate a direction in which the heat medium passes. That is, the heat medium flowing through the supply branch pipe 30 is supplied to the cooling member 42 via the connect fitting 41. The cooling member 42 causes the heat medium to receive the heat received from the heat generation member 43. The cooling member 42 cools the heat generation member 43 by using the heat medium in this manner. The structure of the module 40 is not limited to the example of FIG. 2 as long as the module 40 has a structure in which the heat generation member 43 is cooled using the heat medium. The modules 40 mounted to the casing 200 may have different structures.

As described above, the cooling device 100 of the first example embodiment includes a supply pipe that supplies a heat medium from outside to inside of a casing to which a plurality of modules are mounted, each of the modules including an electronic circuit substrate on which a heat generation member is mounted and a cooling member that is a member that receives heat from the heat generation member and that cools the heat generation member by using the heat medium, and a relay member that is provided inside the casing, includes a first flow channel that delivers the heat medium flowing in from the supply pipe to a plurality of directions, and distributes the heat medium to each of the plurality of cooling members via the first flow channels. In this manner, by supplying the heat medium from the relay member in the casing to each of the modules, the number of pipes entering and exiting the casing can be reduced. Since the flow channels included in the relay member are flow channels through which the heat medium is delivered in the plurality of directions, it is possible to suppress an increase in size of the relay member as compared with a case where the flow channels of the heat medium to the modules are all in the same direction. That is, the cooling device 100 of the first example embodiment can improve storage capacity in the casing to which the plurality of modules including the heat generation members is mounted.

Second Example Embodiment

Next, a cooling device of a second example embodiment will be described. In the second example embodiment, description of contents overlapping with the contents described in the first example embodiment will be partially omitted.

Figure 3:
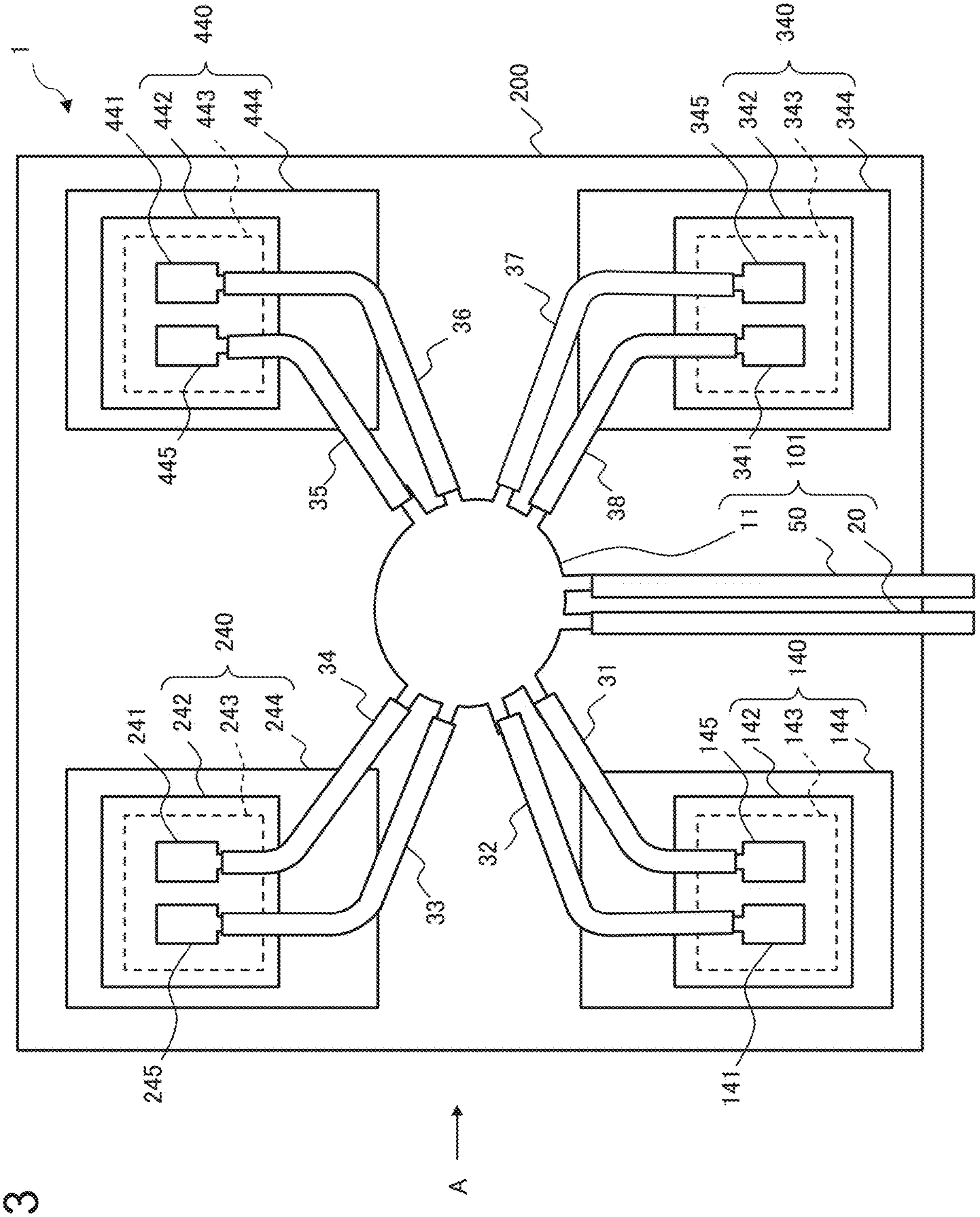
FIG. 3 is a plan view illustrating an example of a configuration of a cooling device of a second example embodiment of the present disclosure.

FIG. 3 is a plan view illustrating an example of a configuration of an electronic device 1 including a cooling device 101 of the second example embodiment. The electronic device 1 is, for example, a server, but is not limited to this example. In the example of FIG. 3, modules 140, 240, 340, and 440 are mounted to a casing 200. The module 140 includes an electronic circuit substrate 144 on which a heat generation member 143 is mounted, and a cooling member 142. The module 240 includes an electronic circuit substrate 244 on which a heat generation member 243 is mounted, and a cooling member 242. Similarly, the module 340 includes an electronic circuit substrate 344 on which a heat generation member 343 is mounted, and a cooling member 342, and the module 440 includes an electronic circuit substrate 444 on which a heat generation member 443 is mounted, and a cooling member 442. The heat generation members 143, 243, 343, and 443 are, for example, a control processing unit (CPU), a memory, and the like, but are not limited to this example. Similarly to the cooling member 42 described in the first example embodiment, the cooling members 142, 242, 342, and 442 are members that cool the heat generation members 143, 243, 343, and 443, respectively. For example, the cooling member 142 is arranged on the heat generation member 143, and cools the heat generation member 143 by causing a heat medium to receive heat received from the heat generation member 143. The cooling members 142, 242, 342, and 442 may also be referred to as cold plates. The modules 140, 240, 340, and 440 may be different devices although cooling methods by the cooling members are similar. The modules 140, 240, 340, and 440 may also be mounted with other members in addition to the members illustrated in FIG. 3.

The cooling members are provided with connect fittings. For example, the cooling member 142 is provided with connect fittings 141 and 145. Flow channels are connected between the connect fittings 141 and 145 and the cooling member 142. The connect fitting 141 is connected to a supply branch pipe 32, and the connect fitting 145 is connected to a discharge branch pipe 31. The heat medium flowing through the supply branch pipe 32 flows into the cooling member 142 via the connect fitting 141. The heat medium having passed through the cooling member 142 then flows into the discharge branch pipe 31 via the connect fitting 145. Similarly, the cooling member 242 is provided with connect fittings 241 and 245, the cooling member 342 is provided with connect fittings 341 and 345, and the cooling member 442 is provided with connect fittings 441 and 445. The connect fittings 241, 341, and 441 are connected to supply branch pipes 34, 38, and 36, respectively, and the connect fittings 245, 345, and 445 are connected to discharge branch pipes 33, 37, and 35, respectively.

[Details of Cooling Device 101]

The cooling device 101 includes a relay member 11, a supply pipe 20, and a discharge pipe 50. As described in the first example embodiment, one end of the supply pipe 20 is connected to the relay member 11, and the other end of the supply pipe 20 is connected to a pump, a radiator, or the like (not illustrated) outside the casing 200. The discharge pipe 50 is a pipe that discharges the heat medium from the inside of the casing 200 to the outside of the casing 200. One end of the discharge pipe 50 is connected to the relay member 11, and the other end of the discharge pipe 50 is connected to a pump, a radiator, or the like outside the casing 200. The relay member is connected to the discharge branch pipes 31, 33, 35, and 37 and the supply branch pipes 32, 34, 36, and 38. The heat medium supplied from the supply pipe 20 is distributed to the supply branch pipes 32, 34, 36, and 38 via the relay member 11. The heat medium discharged from each module flows into the discharge branch pipes 31, 33, 35, and 37. The heat medium then flows into the discharge pipe 50 via the relay member 11.

Figure 4:
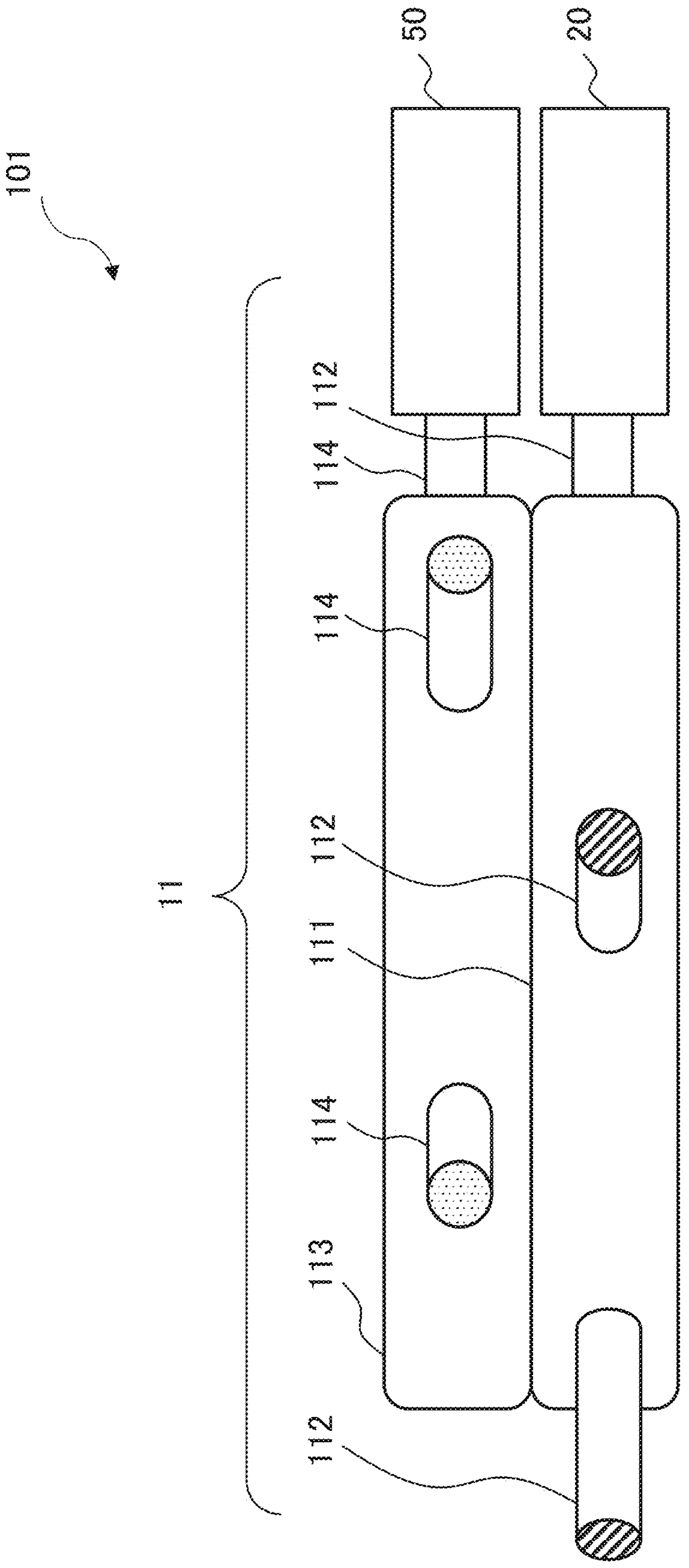
FIG. 4 is a side view illustrating an example of the configuration of the cooling device of the second example embodiment of the present disclosure.

FIG. 4 is a side view illustrating an example of a configuration of the cooling device 101. Specifically, FIG. 4 is a side view of the cooling device 101 as viewed from a viewpoint of A of FIG. 3. In FIG. 4, illustration of the casing 200, the discharge branch pipes 31, 33, 35, and 37, the supply branch pipes 32, 34, 36, and 38, and the modules 140, 240, 340, and 440 is omitted. As illustrated in FIG. 4, the relay member 11 includes a first plate 111 and a second plate 113. The first plate 111 has a supply flow channel 112. The second plate 113 has a discharge flow channel 114.

Figure 5A:
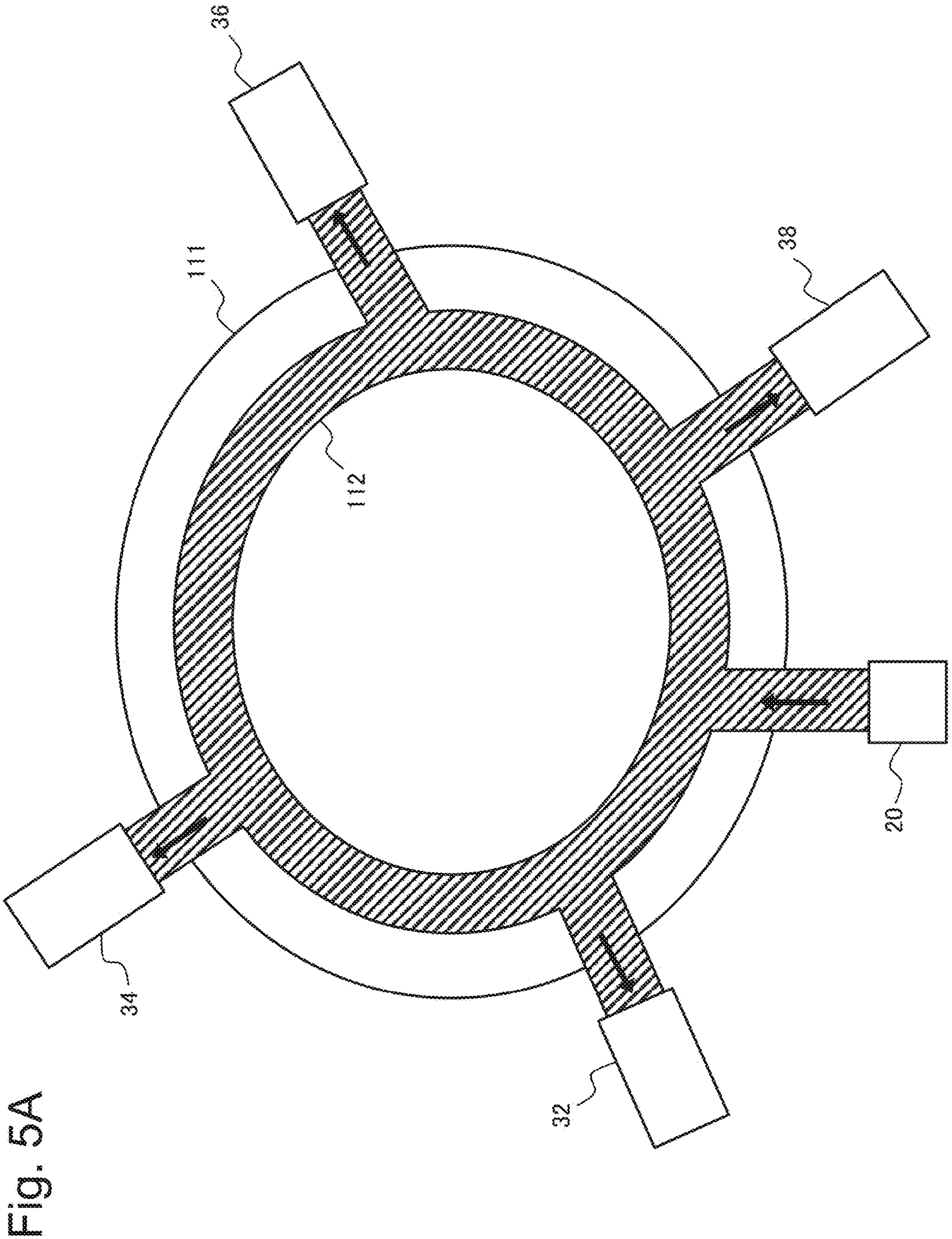
FIG. 5A is a plan view illustrating an example of a structure of a first plate of the second example embodiment of the present disclosure.

FIG. 5A is a plan view illustrating an example of a structure of the first plate. As illustrated in FIG. 5A, the first plate 111 is provided with the supply flow channel 112. A hatched portion in FIG. 5A indicates that the heat medium before receiving heat from the heat generation members flows. The supply flow channel 112 may be a pipe installed in the first plate or a pipe formed in the first plate. The supply flow channel 112 includes a main flow channel provided along an outer periphery of the relay member 11 and a plurality of branch flow channels branching from the main flow channel. As illustrated in FIG. 5A, the main flow channel may be, for example, annular. The branch flow channels are provided in such a way that the heat medium flows in directions different from each other. For example, an angle formed by the branch flow channel connected to the supply branch pipe 32 and the branch flow channel connected to the supply branch pipe 34 may be equal to or more than a certain value. Angles formed by adjacent branch flow channels may be the same or different from each other. The branch flow channels are connected to the supply pipe 20 and the supply branch pipes 32, 34, 36, and 38. As described above, the branch flow channels of the supply flow channel 112 are flow channels that deliver the heat medium in the plurality of directions. Arrows illustrated in FIG. 5A indicate the directions in which the heat medium flows. That is, the heat medium passes through the main flow channel of the supply flow channel 112 from the supply pipe 20. The heat medium then flows into each of the supply branch pipes 32, 34, 36, and 38 via the branch flow channels branching from the main flow channel. That is, the supply flow channel 112 includes the main flow channel provided along the outer periphery of the relay member 11 and the plurality of branch flow channels branching from the main flow channel, and the heat medium delivered from the plurality of branch flow channels is supplied to the different cooling members. The supply flow channel 112 is an example of the first flow channel.

Figure 5B:
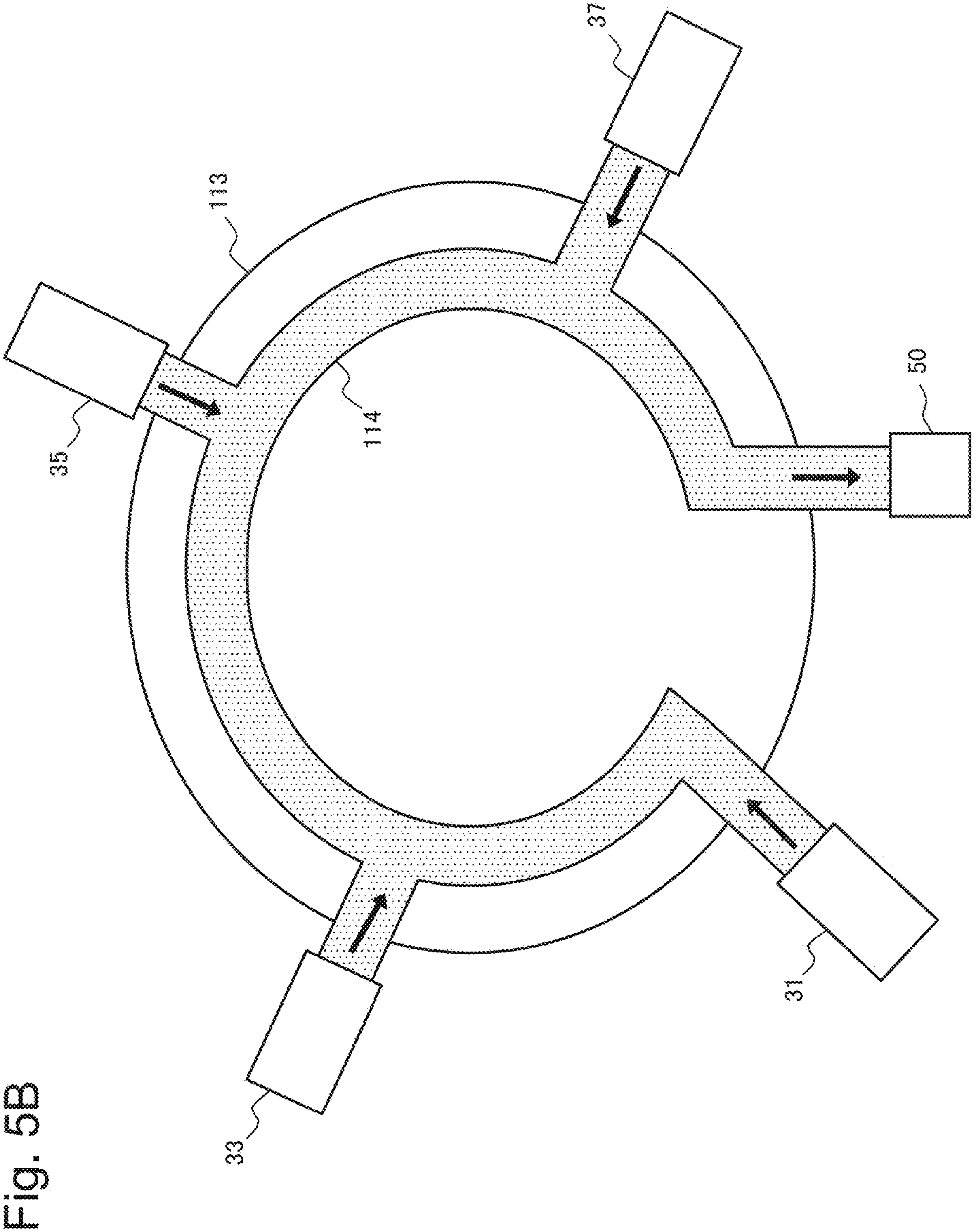
FIG. 5B is a plan view illustrating an example of a structure of a second plate of the second example embodiment of the present disclosure.

FIG. 5B is a plan view illustrating an example of a structure of the second plate. As illustrated in FIG. 5B, the second plate 113 is provided with the discharge flow channel 114. A hatched portion in FIG. 5B indicates that the heat medium after receiving heat from the heat generation members flows. The discharge flow channel 114 may be a pipe installed in the second plate or a pipe formed in the second plate. The discharge flow channel 114 includes a main flow channel provided along the outer periphery of the relay member 11 and a plurality of branch flow channels branching from the main flow channel. As illustrated in FIG. 5B, the main flow channel may be, for example, annular. The branch flow channels are provided in such a way that the heat medium flows in directions different from each other. For example, an angle formed by the branch flow channel connected to the discharge branch pipe 31 and the branch flow channel connected to the discharge branch pipe 33 may be equal to or more than a certain value. Angles formed by adjacent branch flow channels may be the same or different from each other. The branch flow channels are connected to the discharge pipe 50 and the discharge branch pipes 31, 33, 35, and 37. Arrows illustrated in FIG. 5B indicate the directions in which the heat medium flows. That is, the heat medium flowing through each of the discharge branch pipes 31, 33, 35, and 37 passes through the branch flow channels of the discharge flow channel 114 and joins in the main flow channel of the discharge flow channel 114. As described above, the discharge flow channel 114 is a flow channel in which the heat medium delivered from the plurality of directions joins. The heat medium then flows into the discharge pipe 50 from the main flow channel through the branch flow channels. The relay member 11 includes the discharge flow channel 114 that joins the heat medium discharged from each of the cooling members included in the plurality of modules, and delivers the joined heat medium to the discharge pipe 50. The discharge flow channel 114 is an example of a second flow channel.

In the present example embodiment, the relay member 11 distributes the heat medium in four directions, but the number of directions of distribution is not limited to this example. Similarly, the relay member 11 joins the heat medium flowing in from four directions, but the number of directions is also not limited to this example.

[Path of Heat Medium]

Next, a path through which the heat medium flows in the second example embodiment will be described. First, the heat medium supplied from a pump, a radiator, or the like outside the casing 200 flows into the relay member 11 via the supply pipe 20. The heat medium then flows through the supply flow channel 112 of the first plate 111 of the relay member 11, and is distributed to each of the supply branch pipes 32, 34, 36, and 38. For example, the heat medium passing through the supply branch pipe 32 passes through the connect fitting 141 and is supplied to the cooling member 142. The heat medium passes through the cooling member 142 and the connect fitting 145, and is discharged to the discharge branch pipe 31. The heat medium similarly passes in the modules 240, 340, and 440. That is, for the module 240, the heat medium sequentially passes through the supply branch pipe 34, the connect fitting 241, the cooling member 242, the connect fitting 245, and the discharge branch pipe 33. For the module 340, the heat medium sequentially passes through the supply branch pipe 38, the connect fitting 341, the cooling member 342, the connect fitting 345, and the discharge branch pipe 37. For the module 440, the heat medium sequentially passes through the supply branch pipe 36, the connect fitting 441, the cooling member 442, the connect fitting 445, and the discharge branch pipe 35.

The heat medium flowing through each of the discharge branch pipes 31, 33, 35, and 37 joins in the discharge flow channel 114 of the relay member 11. The heat medium is delivered from the discharge flow channel 114 to the discharge pipe 50, and flows into the pump, the radiator, or the like. The heat medium cooled by the radiator or the like is then supplied to the supply pipe 20 again. By circulating the heat medium in this manner, each of the heat generation members 143, 243, 343, and 443 in the casing 200 is cooled.

As described above, the cooling device 101 of the second example embodiment includes a supply pipe that supplies a heat medium from outside to inside of a casing to which a plurality of modules are mounted, each of the modules including an electronic circuit substrate on which a heat generation member is mounted and a cooling member that is a member that receives heat from the heat generation member and that cools the heat generation member by using the heat medium, and a relay member that is provided inside the casing, includes a first flow channel that delivers the heat medium flowing in from the supply pipe to a plurality of directions, and distributes the heat medium to each of the plurality of cooling members via the first flow channels. With this configuration, effects similar to those of the first example embodiment are obtained. That is, the cooling device 101 of the second example embodiment can improve storage capacity in the casing to which the plurality of modules including the heat generation members is mounted.

The cooling device 101 of the second example embodiment further includes the discharge pipe that discharges the heat medium from the inside of the casing to the outside of the casing. The relay member includes the second flow channel that joins the heat medium discharged from each of the cooling members included in the plurality of modules, and delivers the joined heat medium to the discharge pipe. In this manner, by joining the heat medium discharged from each module in the relay member in the casing, the number of pipes entering and exiting the casing can be reduced.

[First Modification]

The relay member 11 may be a cooling member included in a module. For example, it is assumed that there is an electronic circuit substrate on which a heat generation member is mounted under the first plate 111 of the relay member 11. When the heat medium passes through the supply flow channel 112, the heat medium receives heat from the heat generation member under the first plate 111. In this case, for example, the supply flow channel 112 is a flow channel formed in the first plate 111, and the first plate is metal.

As described above, the relay member 11 may be a cooling member included in another module different from the plurality of modules 140, 240, 340, and 440, and may be a cooling member that cools a heat generation member included in the another module. As a result, it is not necessary to consider a space in which only the relay member 11 is arranged in the casing 200.

[Second Modification]

In the second example embodiment, the relay member 11 is arranged at the center of the casing 200, but the position of the arrangement is not limited to this example. For example, the relay member 11 may be arranged between the module 140 and the module 340. That is, the relay member 11 may be arranged between at least any of the plurality of modules in the casing 200.

[Third Modification]

Figure 6A:
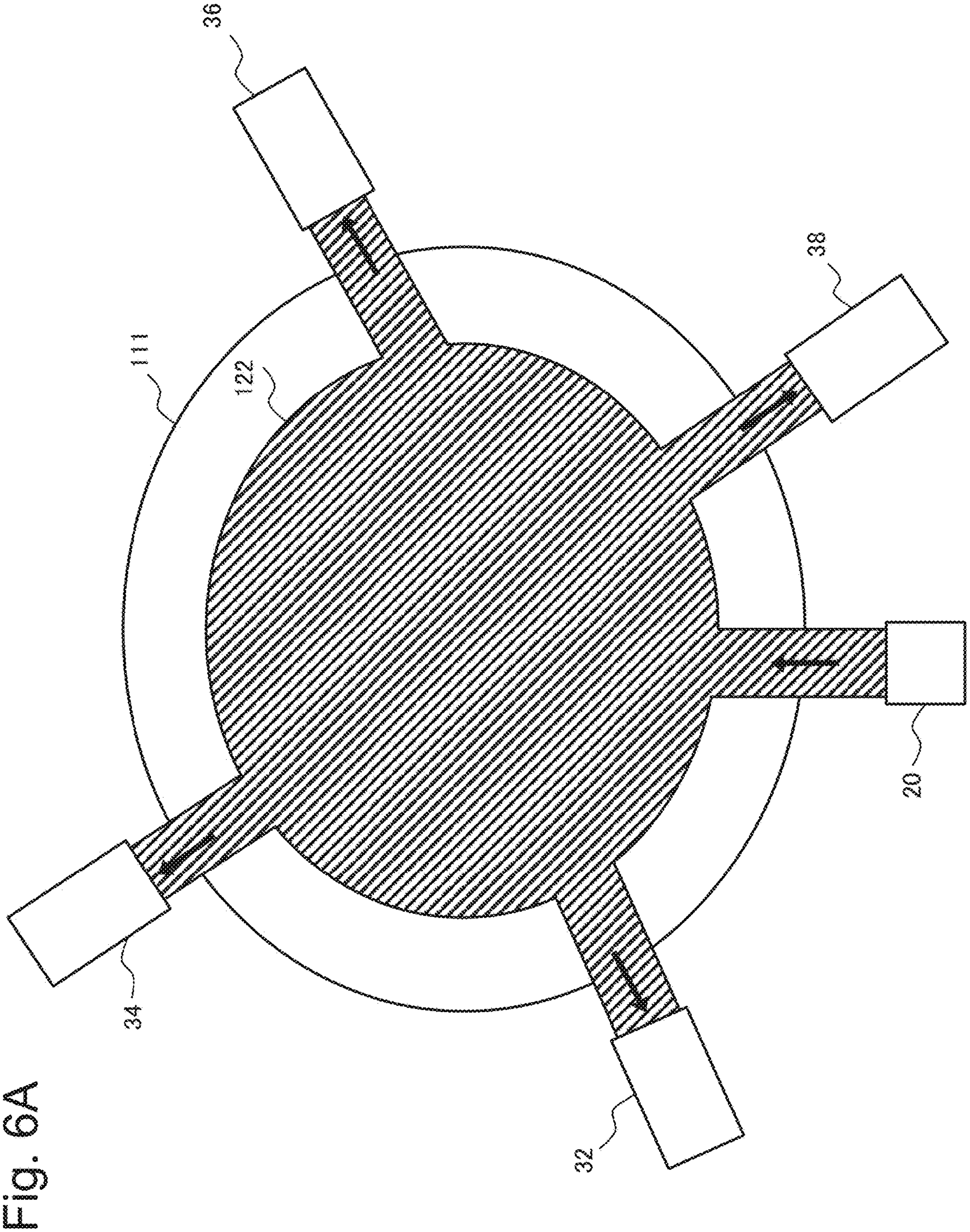
FIG. 6A is a plan view illustrating an example of a structure of the first plate of a third modification of the present disclosure.

The supply flow channel and the discharge flow channel are not limited to those in the examples of FIGS. 5A and 5B. For example, as illustrated in FIG. 6A, the relay member 11 may include a supply flow channel 122 instead of the supply flow channel 112. FIG. 6A is a plan view illustrating an example of a structure of the first plate of a third modification. As illustrated in FIG. 6A, the heat medium flowing in from the supply pipe 20 flows, for example, in a circular main flow channel of the supply flow channel 122. The heat medium is then distributed from the circular main flow channel to each branch flow channel.

Figure 6B:
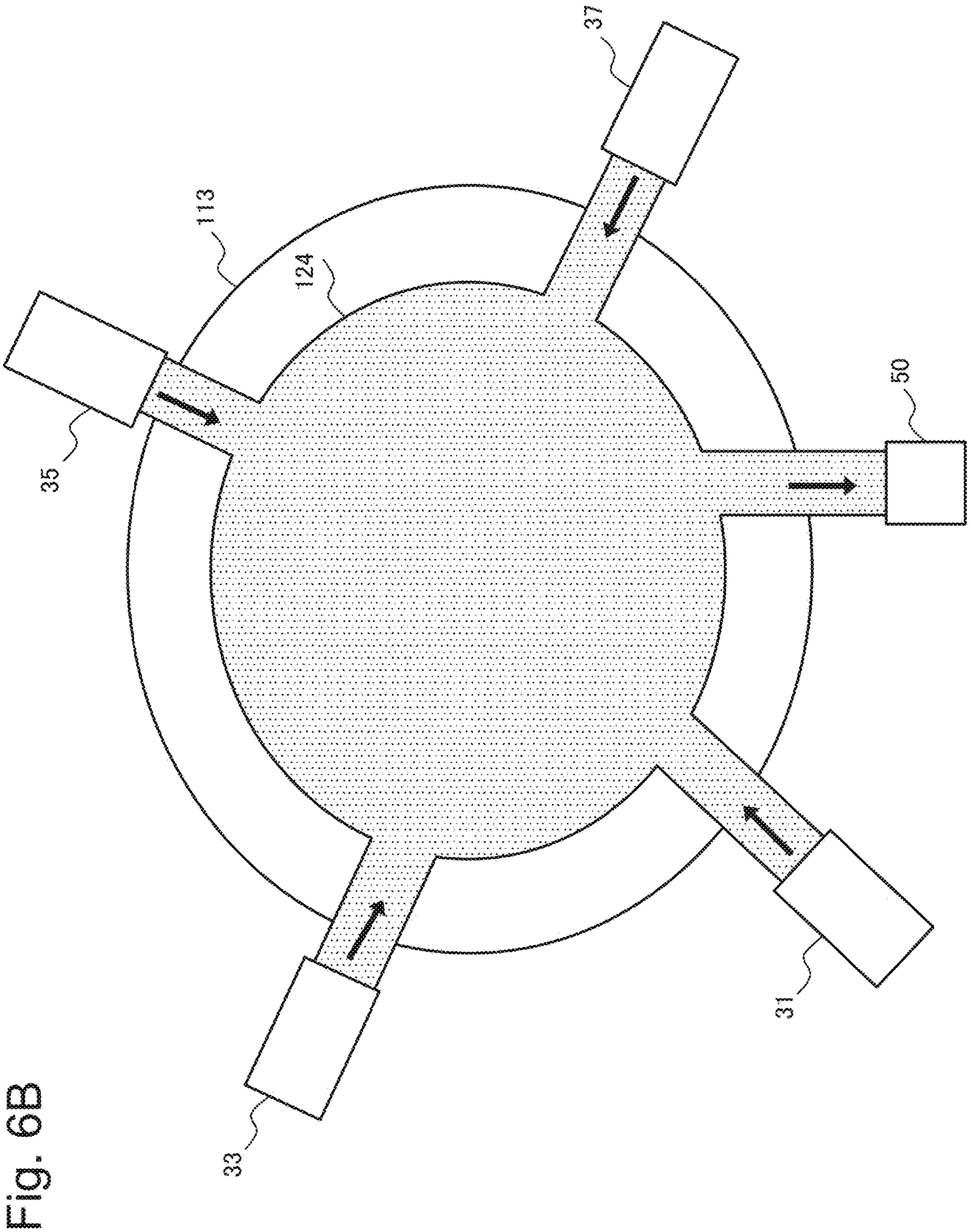
FIG. 6B is a plan view illustrating an example of a structure of the second plate of the third modification of the present disclosure.

Similarly, the relay member 11 may include a discharge flow channel 124 instead of the discharge flow channel 114. FIG. 6B is a plan view illustrating an example of a structure of the second plate of the third modification. As illustrated in FIG. 6B, the heat medium flowing in from each of the discharge branch pipes 31, 33, 35, and 37 flows, for example, in a circular main flow channel of the discharge flow channel 124. The heat medium is then delivered from the circular main flow channel to branch flow channels in the direction of the discharge pipe 50.

Each of the supply flow channels 112 and 122 and the discharge flow channels 114 and 124 is an example, and is not limited to the illustrated example. The supply flow channel may have any structure as long as the heat medium flowing in from the supply pipe 20 is distributed to each of the supply branch pipes 32, 34, 36, and 38. The discharge flow channel may have any structure as long as the heat medium flowing in from each of the discharge branch pipes 31, 33, 35, and 37 is delivered to the discharge pipe 50.

[Fourth Modification]

Figure 7:
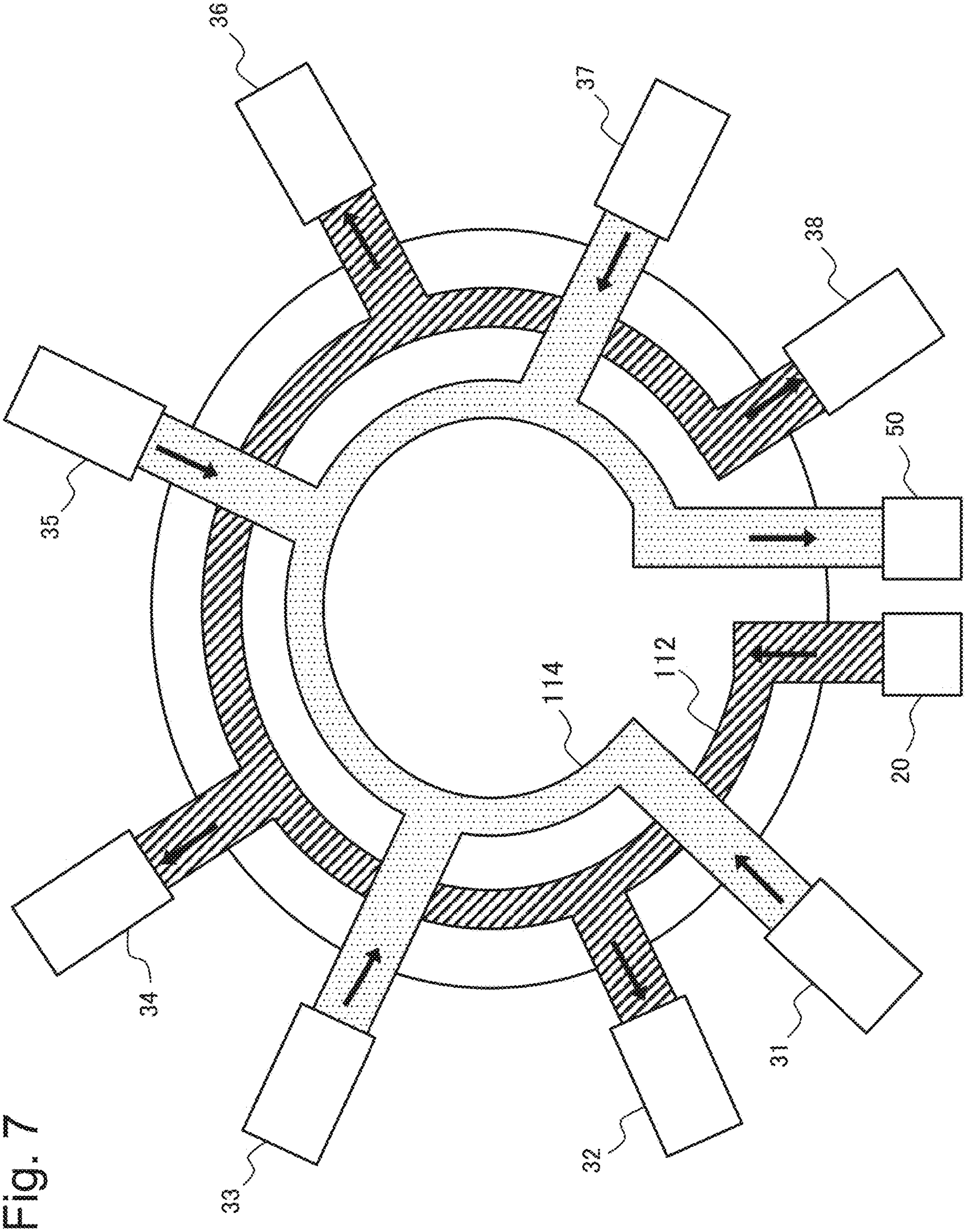
FIG. 7 is a plan view illustrating an example of a structure of a relay member of a fourth modification of the present disclosure.

In the second example embodiment, in the relay member 11, the supply flow channel 112 and the discharge flow channel 114 are provided in the first plate 111 and the second plate 113, respectively, but the supply flow channel 112 and the discharge flow channel 114 may be provided in one plate. FIG. 7 is a plan view illustrating an example of a structure of the relay member 11 of a fourth modification. In the example of FIG. 7, the main flow channel of the supply flow channel 112 is annularly provided. The main flow channel of the discharge flow channel 114 is provided inside the main flow channel of the supply flow channel 112. The supply flow channel 112 and the discharge flow channel 114 are not connected, and for example, the branch flow channels of the discharge flow channel 114 are provided above the supply flow channel 112.

Third Example Embodiment

Next, a cooling device of a third example embodiment will be described. In the present example embodiment, a further example in which a relay member serves as a cooling member will be described. In the third example embodiment, description of contents overlapping with the contents described in the second example embodiment will be partially omitted.

Figure 8:
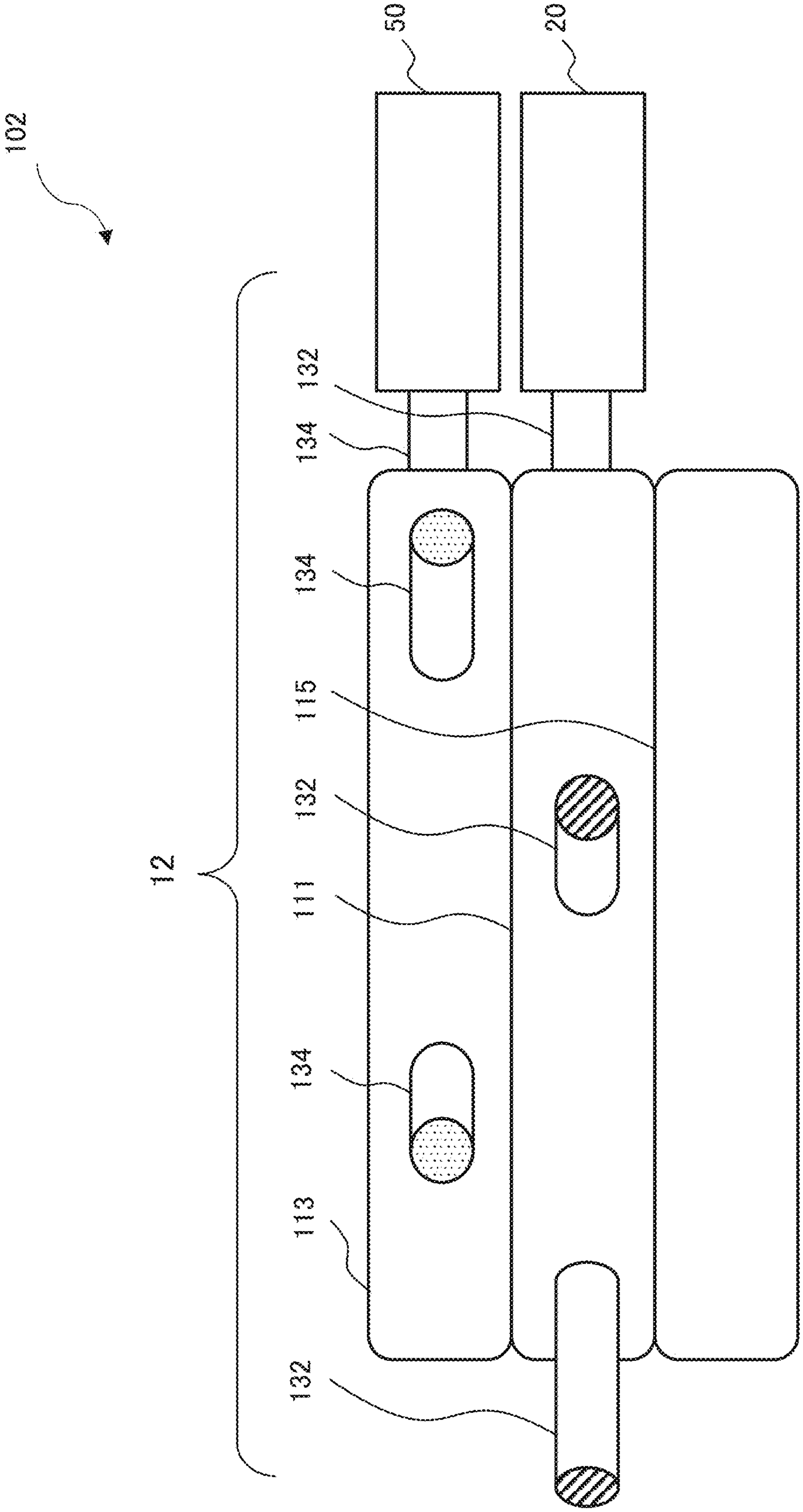
FIG. 8 is a side view illustrating an example of a configuration of a cooling device of a third example embodiment of the present disclosure.

In the third example embodiment, in the electronic device 1 illustrated in FIG. 3, a cooling device 102 is mounted instead of the cooling device 101. FIG. 8 is a side view illustrating an example of a configuration of the cooling device 102. Specifically, FIG. 8 is a side view of the cooling device 102 as viewed from the viewpoint of A of FIG. 3. Similarly to FIG. 4, illustration of a casing 200, discharge branch pipes 31, 33, 35, and 37, supply branch pipes 32, 34, 36, and 38, and modules 140, 240, 340, and 440 is omitted in FIG. 8.

As illustrated in FIG. 8, the cooling device 102 includes a relay member 12 instead of the relay member 11 of the cooling device 101. That is, the cooling device 102 includes the relay member 12, a supply pipe 20, and a discharge pipe 50. The relay member 12 includes a first plate 111, a second plate 113, and a third plate 115. The first plate 111 includes a supply flow channel 132, and the second plate includes a discharge flow channel 134. In the present example embodiment, it is assumed that the relay member 12 is installed on a heat generation member. That is, the heat generation member exists under the third plate.

Figure 9A:
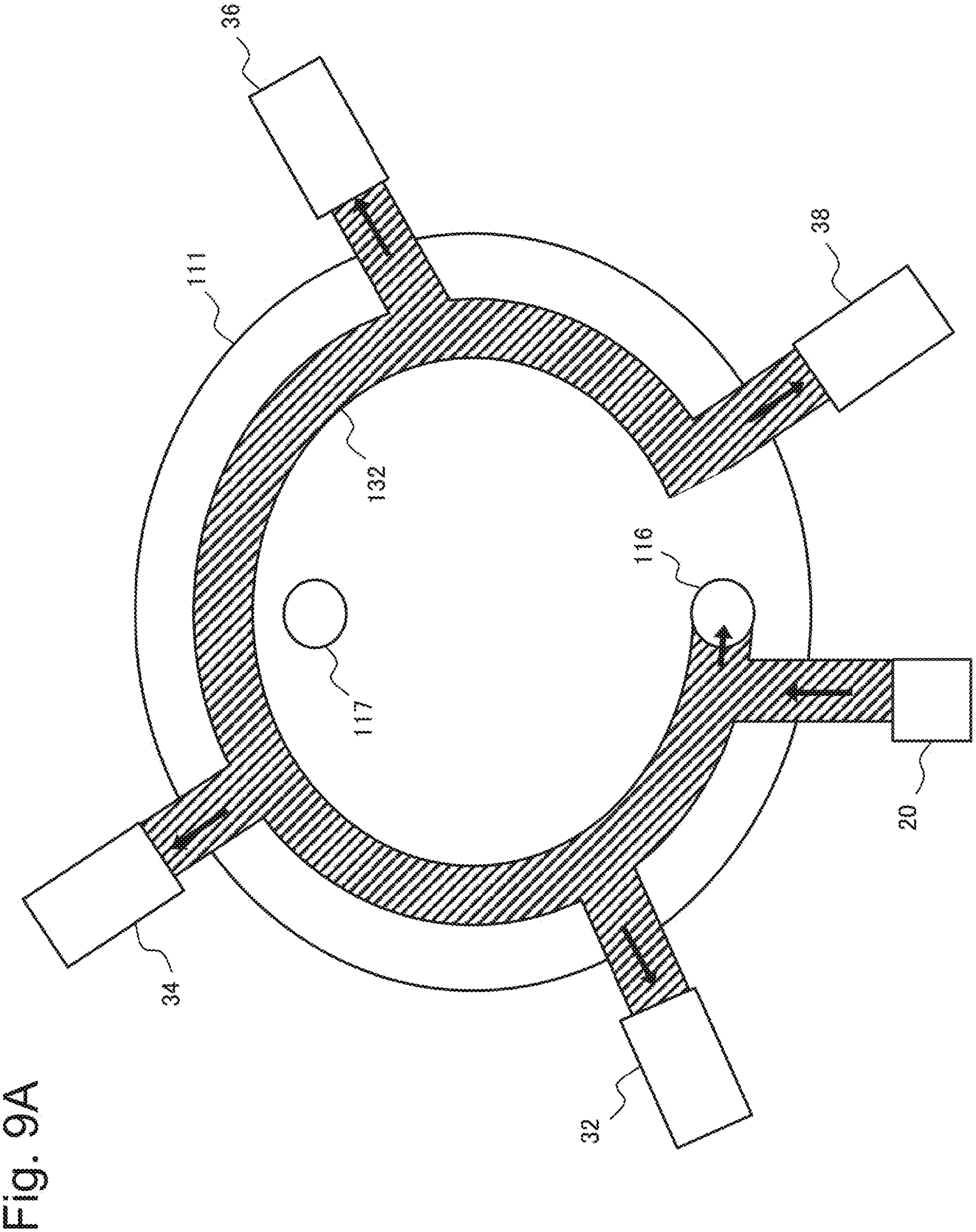
FIG. 9A is a plan view illustrating an example of a structure of a first plate of the third example embodiment of the present disclosure.

FIG. 9A is a plan view illustrating an example of a structure of the first plate 111 of the third example embodiment. The first plate 111 includes the supply flow channel 132, a descending flow channel 116, and an ascending flow channel 117. The descending flow channel 116 is a flow channel connecting the first plate 111 and the third plate 115. The ascending flow channel 117 is a flow channel connecting the second plate 113, the first plate 111, and the third plate 115. The supply flow channel 132 is similar to the supply flow channel 112 except that it is connected to the descending flow channel 116.

A heat medium supplied from the supply pipe 20 flows into a main flow channel of the supply flow channel 132. The heat medium then flows also into the descending flow channel 116 from the main flow channel of the supply flow channel 132, in addition to the supply branch pipes 32, 34, 36, and 38. The heat medium then flows into a cooling flow channel 118 of the third plate 115 via the descending flow channel 116. The ascending flow channel 117 is not connected to the supply flow channel 132. The descending flow channel 116 is an example of a third flow channel, and the ascending flow channel 117 is an example of a fourth flow channel.

Figure 9B:
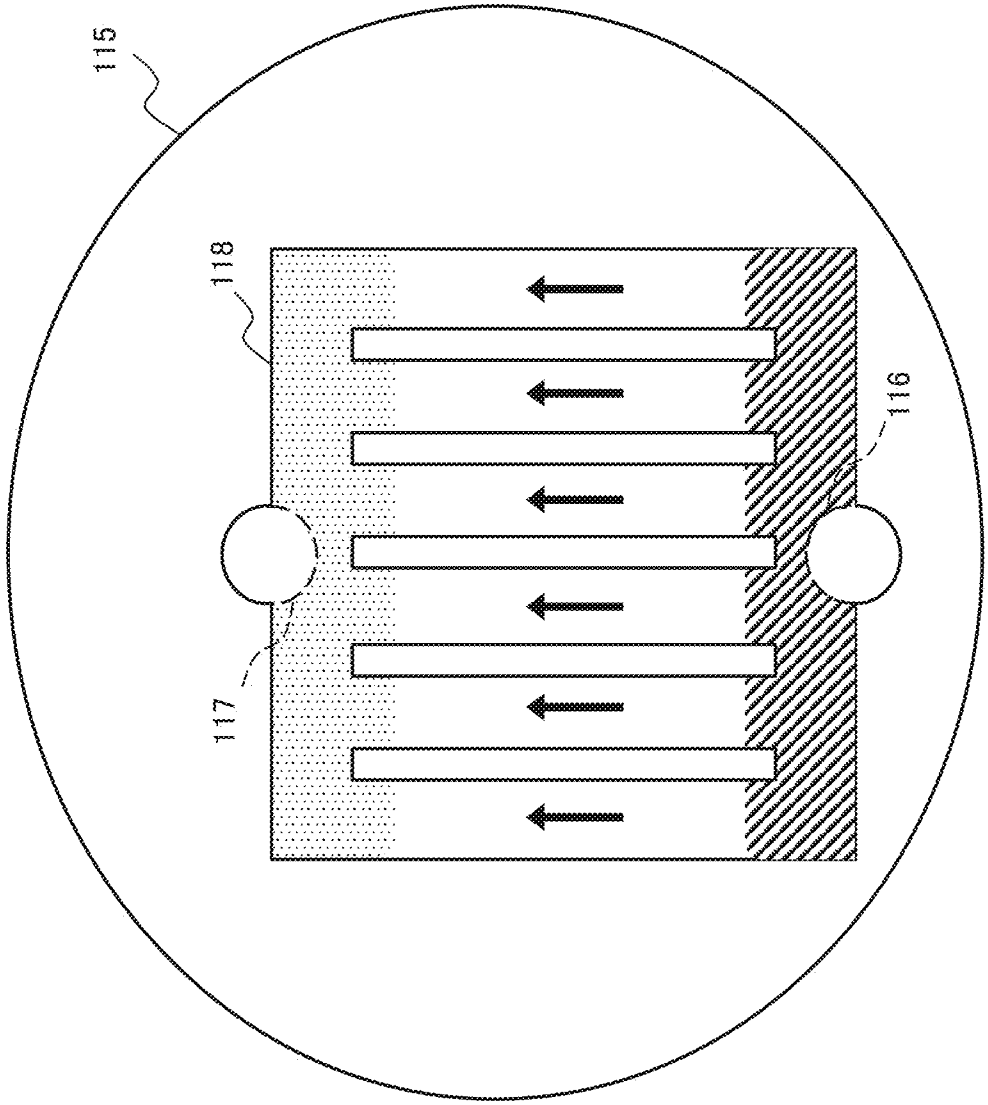
FIG. 9B is a plan view illustrating an example of a structure of a third plate of the third example embodiment of the present disclosure.

FIG. 9B is a plan view illustrating an example of a structure of the third plate 115 of the third example embodiment. The third plate 115 includes the descending flow channel 116, the ascending flow channel 117, and the cooling flow channel 118. The cooling flow channel 118 is formed in, for example, the third plate. The heat medium flowing through the descending flow channel 116 flows through the cooling flow channel 118 in a direction of arrows. At this time, the heat medium flowing through the cooling flow channel 118 receives heat from the heat generation member under the third plate. The heat medium that has received the heat is then discharged to the ascending flow channel 117.

Figure 9C:
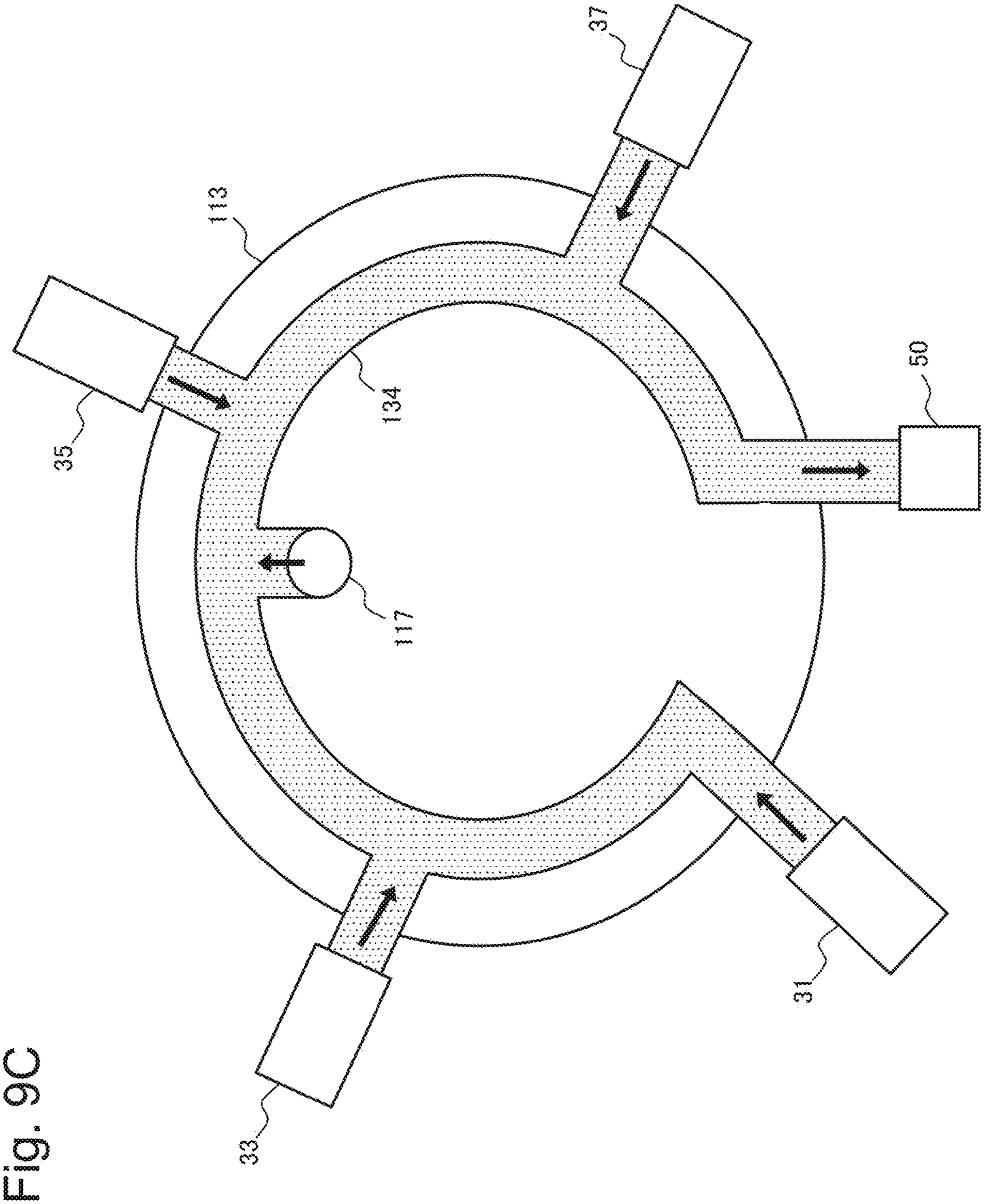
FIG. 9C is a plan view illustrating an example of a structure of a second plate of the third example embodiment of the present disclosure.

FIG. 9C is a plan view illustrating an example of a structure of the second plate 113 of the third example embodiment. The second plate 113 includes the discharge flow channel 134 and the ascending flow channel 117. The discharge flow channel 134 is similar to the discharge flow channel 114 except that it is connected to the ascending flow channel 117. That is, the discharge flow channel 134 joins the heat medium flowing in from each of the discharge branch pipes 31, 33, 35, and 37 and the heat medium flowing in from the ascending flow channel 117. That is, the relay member 12 joins the heat medium flowing in from the fourth flow channel and the heat medium discharged from each of cooling members included in each of the plurality of modules.

As described above, the relay member of the cooling device 102 of the third example embodiment further includes a third flow channel that is a flow channel of the heat medium, and a cooling flow channel that is a flow channel of the heat medium and causes the heat medium to receive heat from the heat generation member of another module different from the plurality of modules 140, 240, 340, and 440. The third flow channel connects the first flow channel and the cooling flow channel. With this configuration, in a case where the relay member is used as the cooling member, the heat generation member in contact with the relay member can be efficiently cooled. Since the heat medium after receiving the heat from the heat generation member does not flow in the first flow channel, it is possible to suppress a decrease in cooling efficiency for the surrounding modules.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2021-098436, filed on Jun. 14, 2021, the disclosure of which is incorporated herein in its entirety by reference.

REFERENCE SIGNS LIST

1 electronic device
10, 11, 12 relay member
20 supply pipe
30, 32, 34, 36, 38 supply branch pipe
31, 33, 35, 37 discharge branch pipe
40,140, 240, 340, 440 module
41, 141, 145, 241, 245, 341, 345, 441, 445 connect fitting
42, 142, 242, 342, 442 cooling member
43, 143, 243, 343, 443 heat generation member
44, 144, 244, 344, 444 electronic circuit substrate
50 discharge pipe
100, 101, 102 cooling device
111 first plate
112, 122, 132 supply flow channel
113 second plate
114, 124, 134 discharge flow channel
115 third plate
116 descending flow channel
117 ascending flow channel
118 cooling flow channel
200 casing

What is claimed is:

1. A cooling device comprising:

a supply pipe configured to supply a heat medium from outside to inside of a casing to which a plurality of modules are mounted, wherein each module of the plurality of modules includes an electronic circuit substrate on which a heat generation member is mounted and a cooling member that receives heat from the heat generation member and cools the heat generation member by using the heat medium; and a relay member that is provided inside the casing, comprising a first flow channel configured to deliver the heat medium flowing in from the supply pipe to a plurality of directions, and to distribute the heat medium to each of the plurality of cooling members via the first flow channel, wherein the first flow channel includes a main flow channel through which the heat medium flowing in from the supply pipe flows, and a plurality of branch flow channels through which the heat medium branches from the main flow channel, wherein the plurality of branch flow channels extend radially from the first flow channel and deliver the heat medium in directions different from each other and supplies the heat medium to the plurality of cooling members, and wherein the relay member is the cooling member included in another module different from the plurality of modules, and cools the heat generation member in contact with the relay member included in the another module.

2. The cooling device according to claim 1, further comprising a discharge pipe configured to discharge the heat medium from the inside to the outside of the casing, wherein the relay member includes a second flow channel that joins the heat medium discharged from each of the plurality of cooling members included in each of the plurality of modules, and is configured to deliver the joined heat medium to the discharge pipe.

3. The cooling device according to claim 1, wherein:

the main flow channel is provided along an outer periphery of the relay member, and the heat medium delivered from the plurality of branch flow channels is supplied to the plurality of cooling members.

4. The cooling device according to claim 1, wherein:

the relay member further includes a third flow channel that is a flow channel of the heat medium, and a cooling flow channel that is a flow channel of the heat medium and is configured to cause the heat medium to receive heat from the heat generation member of the another module, and the third flow channel is a flow channel that connects the first flow channel and the cooling flow channel.

5. The cooling device according to claim 4, wherein the relay member further includes a fourth flow channel into which the heat medium discharged from the cooling flow channel flows, and joins the heat medium flowing in from the fourth flow channel and the heat medium discharged from each of the plurality of cooling members included in each of the plurality of modules.

6. The cooling device according to claim 1, wherein the relay member is arranged between at least any of the plurality of modules.

7. The cooling device according to claim 1, wherein the main flow channel is annular.

* * * * *